(12) United States Patent
Hashimoto

(10) Patent No.: US 9,929,323 B2
(45) Date of Patent: Mar. 27, 2018

(54) METHOD FOR MANUFACTURING LIGHT-EMITTING DEVICE

(71) Applicant: NICHIA CORPORATION, Anan-shi (JP)

(72) Inventor: Toru Hashimoto, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/480,416

(22) Filed: Apr. 6, 2017

(65) Prior Publication Data
US 2017/0294563 A1    Oct. 12, 2017

(30) Foreign Application Priority Data
Apr. 6, 2016 (JP) .................. 2016-076829

(51) Int. Cl.
*H01L 33/54* (2010.01)
*H01L 33/50* (2010.01)
(Continued)

(52) U.S. Cl.
CPC .......... *H01L 33/54* (2013.01); *C09K 11/0883* (2013.01); *C09K 11/617* (2013.01); *C09K 11/7734* (2013.01); *H01L 33/0095* (2013.01); *H01L 33/50* (2013.01); *H01L 33/504* (2013.01); *H01L 33/56* (2013.01); *H01L 33/60* (2013.01); *H01L 33/62* (2013.01); *H01L 2933/005* (2013.01); *H01L 2933/0041* (2013.01);
(Continued)

(58) Field of Classification Search
CPC ..... H01L 33/54; H01L 33/60; H01L 33/0095; H01L 33/50
See application file for complete search history.

(56) References Cited

U.S. PATENT DOCUMENTS

| 2014/0131753 | A1 | 5/2014 | Ishida et al. |
| 2014/0217437 | A1 | 8/2014 | Kim |
| 2015/0263254 | A1 | 9/2015 | Miyoshi et al. |

FOREIGN PATENT DOCUMENTS

| JP | 2011-068193 | 3/2011 |
| JP | 2014-110333 | 6/2014 |
(Continued)

*Primary Examiner* — Amar Movva
(74) *Attorney, Agent, or Firm* — Mori & Ward, LLP

(57) ABSTRACT

The method for manufacturing a light-emitting device includes flip-chip mounting a first light-emitting element and a second light-emitting element on a substrate separately from each other, bonding a first light-transmissive member to the first light-emitting element, the first light-transmissive member having a first lateral surface, and bonding a second light-transmissive member to the second light-emitting element, the second light-transmissive member having a second lateral surface, with the second lateral surface being separated from and facing the first lateral surface, scraping at least one of the first lateral surface and the second lateral surface to expose at least one of a modified first lateral surface and a modified second lateral surface, forming a light-reflective covering member on the substrate to cover the first lateral surface or the modified first lateral surface, and the second lateral surface or the modified second lateral surface, and cutting the substrate and the covering member between the first lateral surface or the modified first lateral surface, and the second lateral surface or the modified second lateral surface.

7 Claims, 6 Drawing Sheets

(51) Int. Cl.
  *C09K 11/08* (2006.01)
  *C09K 11/61* (2006.01)
  *C09K 11/77* (2006.01)
  *H01L 33/00* (2010.01)
  *H01L 33/56* (2010.01)
  *H01L 33/60* (2010.01)
  *H01L 33/62* (2010.01)

(52) U.S. Cl.
  CPC ................ *H01L 2933/0058* (2013.01); *H01L 2933/0066* (2013.01)

(56) References Cited

FOREIGN PATENT DOCUMENTS

| | | |
|---|---|---|
| JP | 2014-207349 | 10/2014 |
| JP | 2014-216622 | 11/2014 |
| WO | WO 2014/081042 | 5/2014 |
| WO | WO 2015/104623 | 7/2015 |

METHOD FOR MANUFACTURING LIGHT-EMITTING DEVICE

CROSS-REFERENCE TO RELATED APPLICATION

This application claims the benefit of Japanese Patent Application No. 2016-076829, filed on Apr. 6, 2016, the entire disclosure of which is hereby incorporated herein by reference in its entirety.

BACKGROUND

The present disclosure relates to a method for manufacturing a light-emitting device.

For example, Japanese Unexamined Patent Application Publication No. 2011-066193 (see FIG. 50 to FIG. 68) discloses methods for manufacturing optical devices that include semiconductor substrates, optical elements mounted on the semiconductor substrates, fluorescent material layers layered on the optical elements, and reflective resin units covering the lateral surfaces of the optical elements and the fluorescent material layers.

In the methods for manufacturing optical devices disclosed in Japanese Unexamined Patent Application Publication No. 2011-066193, fluorescent material sheets are layered on optical element sheets, the optical element sheets and the fluorescent material sheets are cut together, and reflective resin layers are formed in the resulting grooves. Accordingly, the cutting width of the fluorescent material sheets is required to be large to ensure the reflective resin units covering the lateral surfaces of the fluorescent material layers.

Thus, an embodiment of the present disclosure has an object to provide a method for manufacturing a light-emitting device in which the cutting quantity of a light-transmissive member disposed on a light-emitting element can be reduced and in which a covering member covering a lateral surface of the light-transmissive member can have a sufficient thickness.

SUMMARY

A method for manufacturing a light-emitting device according to an embodiment of the present disclosure includes in order: flip-chip mounting a first light-emitting element and a second light-emitting element on a substrate separately from each other, bonding a first light-transmissive member having a first lateral surface to the first light-emitting element, bonding a second light-transmissive member having a second lateral surface to the second light-emitting element such that the second lateral surface is separated from and faces to the first lateral surface, scraping at least one of the first lateral surface and the second lateral surface to expose at least one of a modified first lateral surface and a modified second lateral surface, providing a light-reflective covering member on the substrate to cover the first lateral surface or the modified first lateral surface, and the second lateral surface or the modified second lateral surface, and cutting the substrate and the covering member between the first lateral surface or the modified first lateral surface, and the second lateral surface or the modified second lateral surface.

With a method for manufacturing a light-emitting device in an embodiment of the present disclosure, a covering member covering a lateral surface of a light-transmissive member can have a sufficient thickness while reducing the cutting quantity of the light-transmissive member.

DETAILED DESCRIPTION

Figure 1A:
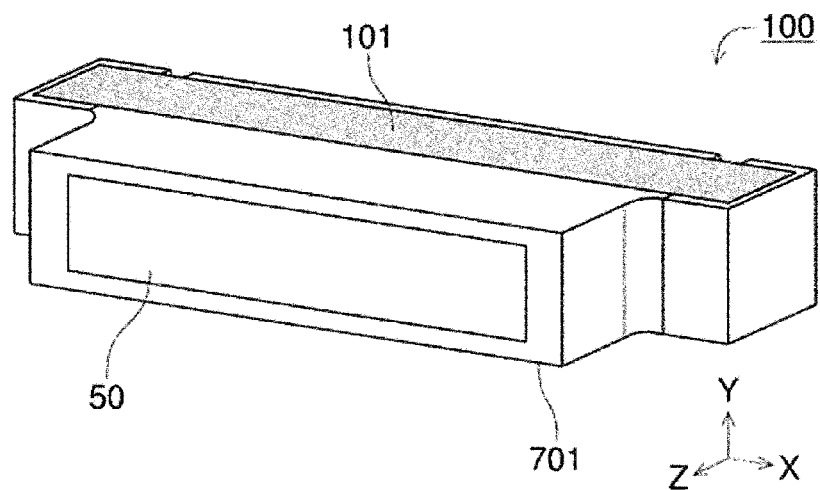
FIG. 1A is a schematic perspective view of a light-emitting device according to an embodiment of the present disclosure.

The following describes an embodiment of the disclosure referring to the accompanying drawings as appropriate. A light-emitting device and a method for manufacturing the light-emitting device to be described below are intended to embody the technical concept of the present disclosure and are not intended to limit the present disclosure to the device and the method below unless specifically stated otherwise. It is noted that there is a case where magnitudes or positional relations of members illustrated in the drawings are exaggerated in order to clarify the descriptions.

The visible wavelength range refers to the wavelength range of equal to or more than 380 nm and equal to or less than 780 nm, the blue range refers to the wavelength range of equal to or more than 420 nm and equal to or less than 480 nm, the green range refers to the wavelength range of equal to or more than 500 nm and equal to or less than 560 nm, the yellow range refers to the wavelength range of more than 560 nm and equal to or less than 590 nm, and the red range refers to the wavelength range of equal to or more than 610 nm and equal to or less than 750 nm herein.

First Embodiment

Figure 1B:
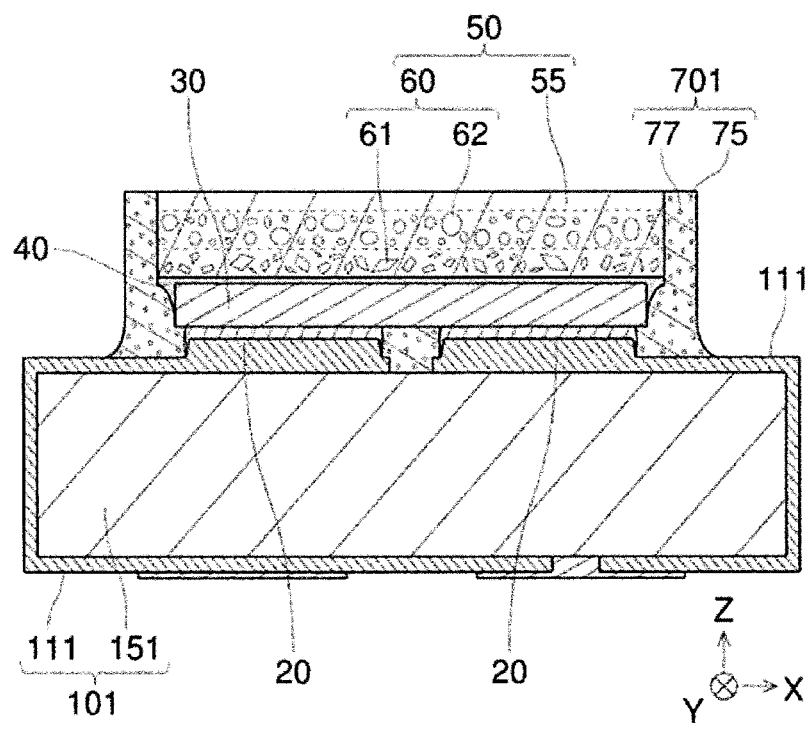
FIG. 1B is a schematic cross-sectional view of the light-emitting device according to the embodiment of the present disclosure.
Figure 2:
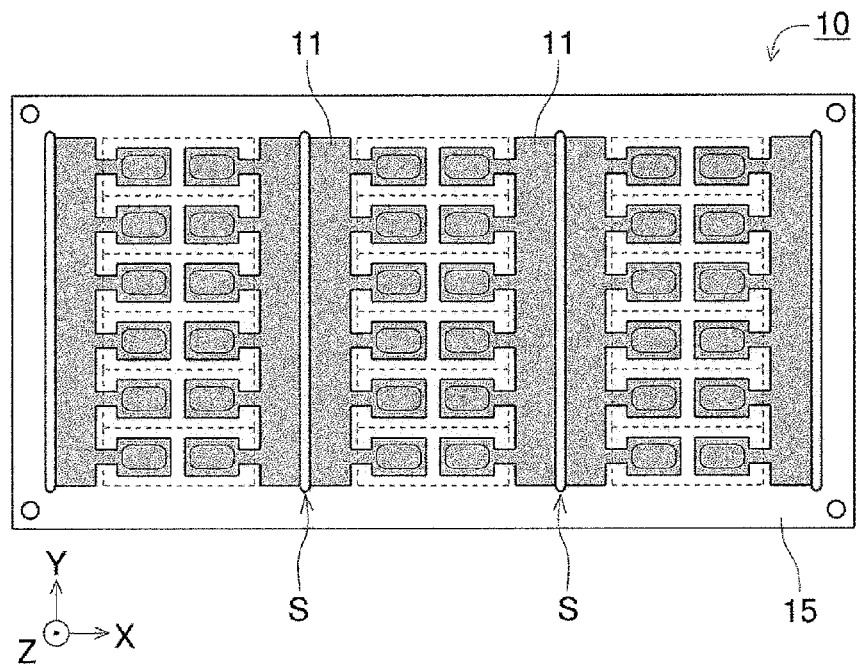
FIG. 2 is a schematic top view of an illustrative substrate used for manufacturing the light-emitting device according to the embodiment of the present disclosure.

FIG. 1A and FIG. 1B are respectively a schematic perspective view and a schematic cross-sectional view of a light-emitting device 100 according to a first embodiment. FIG. 2 is a schematic top view of an illustrative substrate 10 used for manufacturing the light-emitting device 100 according to the first embodiment. FIG. 3A to FIG. 3E are schematic cross-sectional views for respectively illustrating first to fifth steps in a method for manufacturing the light-emitting device 100 according to the first embodiment.

In FIGS. 1A and 1B, the width direction of the light-emitting device 100 is the X direction, the thickness direction is the Y direction, and the front-back (depth) direction is the Z direction. Each of these X, Y, and Z directions (axes) is perpendicular to the other two directions (axes). More particularly, the right direction is the $X_+$ direction, the left direction is the $X_-$ direction, the upper direction is the $Y_+$ direction, the lower direction is the $Y_-$ direction, the front direction is the $Z_+$ direction, and the back direction is $Z_-$ the direction. The $Y_-$ direction is the mounting direction of the light-emitting device 100. The $Z_+$ direction is the main emitting direction of the light-emitting device 100. The X, Y, and Z directions in FIG. 2 and FIG. 3A to FIG. 3E correspond to the X, Y, and Z directions in FIGS. 1A and 1B. In FIG. 2 and FIG. 3A to FIG. 3E, the X direction is the lateral direction, the Y direction is the longitudinal direction, and the Z direction is the up-down direction. Hereinafter, the X direction is referred to as a first direction, and the Y direction is referred to as a second direction.

(Light-Emitting Device 100)

As shown in FIGS. 1A and 1B, the light-emitting device 100 according to the first embodiment includes a substrate piece 101, electrically-conductive adhesive members 20, a light-emitting element 30, a light-guiding member 40, a light-transmissive member 50, and a light-reflective covering member 701. The substrate piece 101 includes wirings 111 and a base 151 supporting the wirings 111. The light-emitting element 30 is a light-emitting diode chip that is long in the X direction and short in the Y direction. The light-emitting element 30 is flip-chip mounted on the wirings 111 of the substrate piece via the electrically-conductive adhesive members 20. The light-transmissive member 50 is made by incorporating a wavelength conversion substance 60 in a matrix 55. The light-transmissive member 50 is a rectangular-cuboid piece that is long in the X direction and short in the Y direction. The light-transmissive member 50 is large enough to cover the entire light-emitting element 30 in a front view. The light-transmissive member 50 is bonded to the light-emitting element 30 with the light-guiding member 40 sandwiched therebetween. The covering member 701 is made by incorporating a white pigment 77 in a matrix 75. The covering member 701 is formed on the substrate piece 101 and covers the lateral surfaces of the light-emitting element 30, the lateral surfaces of the light-guiding member 40, and the lateral surfaces of the light-transmissive member 50. The covering member 701 encompasses the entire side peripheries of the light-emitting element 30 and the light-transmissive member 50. The front surface of the light-transmissive member 50 and the front surface of the covering member 701 constitute approximately the same surface.

The wirings 111 are obtained by singulating wirings 11 to be described later. The base 151 is obtained by singulating a base 15 to be described later. The covering member 701 is obtained by singulating a covering member 70 to be described later. The light-emitting element 30 includes a first light-emitting element 31 or a second light-emitting element 32 to be described later. The light-transmissive member 50 includes a first light-transmissive member 51 or a second light-transmissive member 52 to be described later.

For example, the light-emitting device 100 having such a constitution is soldered to a circuit substrate via an external-connecting terminal portion of a positive/negative electrode of the wirings 111 and emits light if electricity is fed through a circuit. At this time, the high light reflectance of the covering member 701 deflects forward much of light laterally emitted from the light-emitting element 30 and the light-transmissive member 50, and the main emitting region of the light-emitting device 100 is thus the front surface of the light-transmissive member 50.

(Method For Manufacturing Light-emitting Device 100)

As shown in FIG. 2, the substrate 10 is a collective substrate in which a plurality of substrate pieces 101 for light-emitting devices are connected to one another. The substrate 10 includes the wirings 11 and the base 15 supporting the wirings 11. The base 15 has a plurality of through holes S, at regular intervals in the X direction, that penetrate from the upper surface to the lower surface and are long in the Y direction. On the upper surface of the substrate 10, light-emitting elements including the first light-emitting element 31 and the second light-emitting element 32 to be described later are mounted in a region between two through holes S, more particularly, on the central portion of the region. In the region between the two through holes S, one wiring 11 includes positive/negative element-connecting terminal portions on the central portion of the upper surface of the base 15, a positive/negative external-connecting terminal portion disposed from a left/right end portion of the upper surface of the base 15 to a left/right end portion of the lower surface through the lateral surface of one through hole S, and lead wiring portions connecting these terminal portions on the upper surface of the base 15. As described above, the region between the two through holes S of the substrate 10 is constituted of a plurality of substrate pieces 101 for light-emitting devices, the substrate pieces 101 connected to one another in the Y direction. Cutting the region between the two through holes S in the X direction realizes singulation into individual substrate pieces 101 for light-emitting devices.

As shown in FIG. 3A to FIG. 3E, the method for manufacturing the light-emitting device 100 according to the first embodiment includes the first to fifth steps below in the order of the step numbers.

Figure 3A:
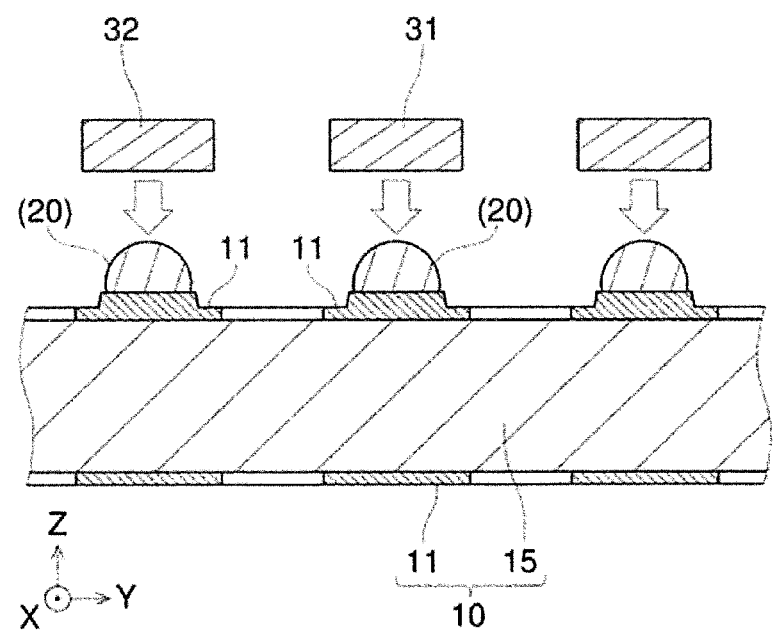
FIG. 3A is a schematic cross-sectional view for illustrating a first step in a method for manufacturing the light-emitting device according to the embodiment of the present disclosure.

The first step is a step of flip-chip mounting the first light-emitting element 31 and the second light-emitting element 32 separately from each other on the substrate 10, as shown in FIG. 3A. That is, positive/negative electrodes of the first light-emitting element 31 and the second light-emitting element 32 are respectively connected to the positive/negative element-connecting terminal portions of the wirings 11 via the electrically-conductive adhesive members 20. At this time, in the case where the first light-emitting element 31 and the second light-emitting element 32 have rectangular shapes in a top view, the first light-emitting element 31 and the second light-emitting element 32 are preferably mounted so that two lateral surfaces facing each other will be approximately parallel to each other in the X direction and so that the other two lateral surfaces facing each other will be approximately parallel to each other in the Y direction. More specifically, for example, electrically-conductive adhesive members (20) as a paste are applied to the positive/negative element-connecting terminal portions, the first light-emitting element 31 and the second light-emitting element 32 are mounted on the electrically-conductive adhesive members (20), and the electrically-conductive adhesive members (20) are molten by heat treatment in a reflow oven or the like and then solidified by cooling. Note that reference numbers in parentheses in the present specification and the drawings mean that the components are in states before their final forms.

Figure 3B:
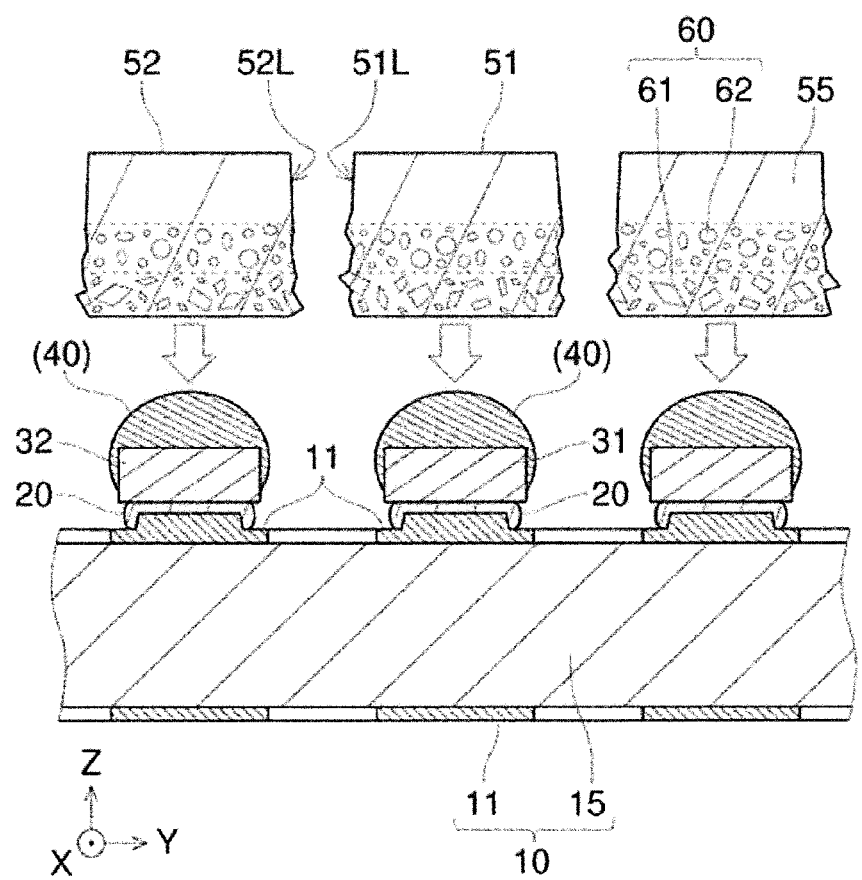
FIG. 3B is a schematic cross-sectional view for illustrating a second step in the method for manufacturing the light-emitting device according to the embodiment of the present disclosure.

The second step is a step, after the first step, of bonding the first light-transmissive member 51 having a first lateral surface 51L to the first light-emitting element 31 and bonding the second light-transmissive member 52 having a second lateral surface 52L to the second light-emitting element 32 so that the second lateral surface 52L will be separated from and face the first lateral surface 51L, as shown in FIG. 3B. At this time, in the case where the first light-emitting element 31, the second light-emitting element 32, the first light-transmissive member 51, and the second light-transmissive member 52 have rectangular shapes in a top view, the bonding is preferably performed so that the lateral surfaces of the first light-transmissive member 51 and the second light-transmissive member 52 will be approximately parallel to respective lateral surfaces of the first light-emitting element 31 and the second light-emitting element 32. More specifically, for example, light-guiding members (40) as a liquid are applied to the first light-emitting element 31 and the second light-emitting element 32 mounted on the substrate 10, the first light-transmissive member 51 and the second light-transmissive member 52 are mounted on the light-guiding members (40), and the light-guiding members (40) are cured by heat treatment in an oven or the like. A "liquid" in the present specification includes a sol and a slurry.

The first light-transmissive member 51 and the second light-transmissive member 52 are produced, for example, by cutting a sheet into pieces, that is, singulating the sheet. A non-rotary blade is preferably used for cutting the sheet in view of ease of reducing the width of cut of the sheet. Examples of the non-rotary blade include a draw-cutting or push-cutting cutter. To make the first lateral surface 51L and the second lateral surface 52L comparatively flat, ultrasonic waves are preferably applied to the non-rotary blade. This cutting of the sheet is also preferably performed with a dry cutting device for the same reason as will be described later.

Figure 3C:
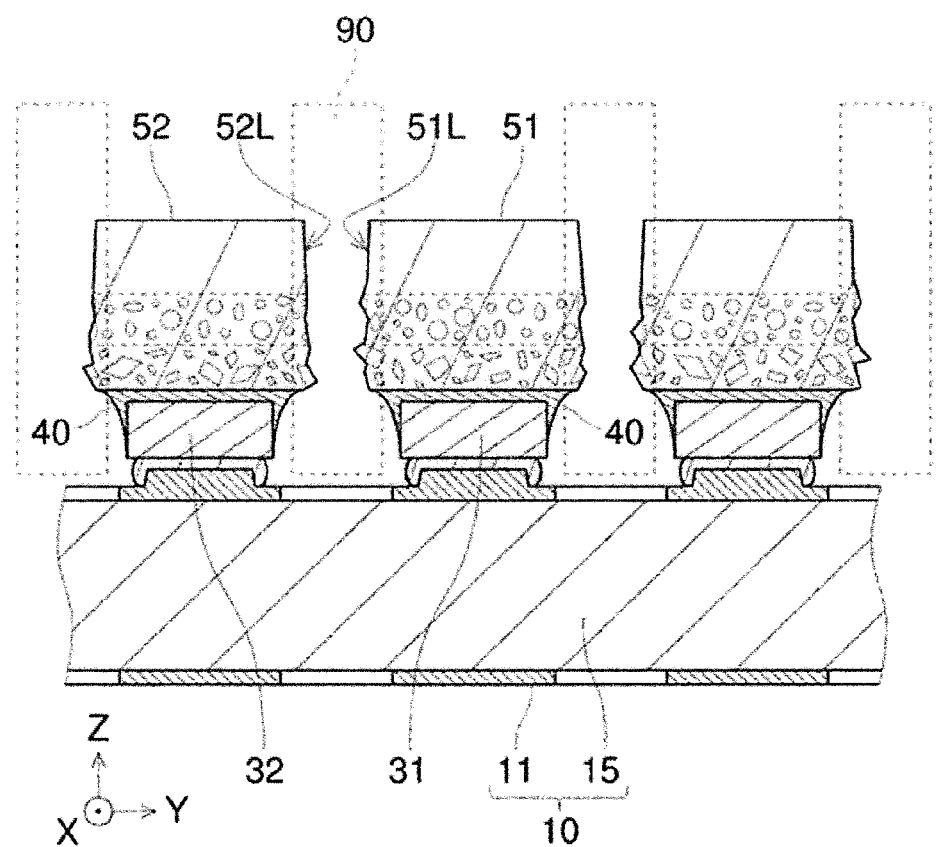
FIG. 3C is a schematic cross-sectional view for illustrating a third step in the method for manufacturing the light-emitting device according to the embodiment of the present disclosure.

The third step is a step, after the second step, of scraping the first lateral surface 51L of the first light-transmissive member and/or the second lateral surface 52L of the second light-transmissive member to expose a modified first lateral surface 51LS and/or a modified second lateral surface 52LS, as shown in FIG. 3C. More specifically, for example, a cutting tool 90 that is a disc-shaped rotary blade is set at a predetermined position in the Y direction, that is, at a position at which the blade of the cutting tool 90 has contact with at least one of the first lateral surface 51L and the second lateral surface 52L, with the faces of the disc being parallel to the X direction, and the cutting tool 90 travels in the X direction on the substrate 10 with the cutting tool 90 being separated from the upper surface of the substrate 10. The modified first lateral surface 51LS is a lateral surface existing instead of the first lateral surface 51L after scraping the first lateral surface 51L of the first light-transmissive member. The modified second lateral surface 52LS is a lateral surface existing instead of the second lateral surface 52L after scraping the second lateral surface 52L of the second light-transmissive member.

Figure 3D:
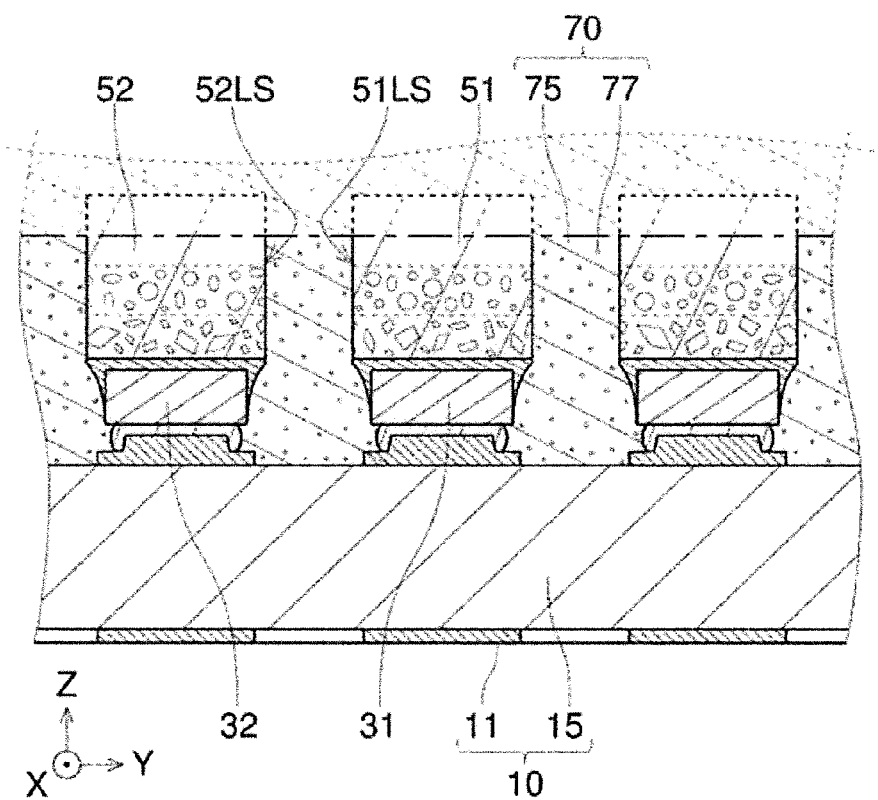
FIG. 3D is a schematic cross-sectional view for illustrating a fourth step in the method for manufacturing the light-emitting device according to the embodiment of the present disclosure.

The fourth step is a step, after the third step, of forming the light-reflective covering member 70 on the substrate 10 to cover the first lateral surface 51L or the modified first lateral surface 51LS, and the second lateral surface 52L or the modified second lateral surface 52LS, as shown in FIG. 3D. More specifically, for example, a liquid covering member 70 is charged in the peripheries of the first light-emitting element 31, the second light-emitting element 32, the first light-transmissive member 51, and the second light-transmissive member 52 on the substrate 10, and the covering member 70 is cured by heat treatment in an oven or the like. At this time, for example, the covering member 70 is formed so that the first light-transmissive member 51 and the second light-transmissive member 52 will be completely buried in the covering member 70, and the upper surface of the first light-transmissive member 51 and the upper surface of the second light-transmissive member 52 are then exposed from the covering member 70 by grinding or blasting. Alternatively, the liquid covering member 70 may be charged and cured while pressing the upper surface of the first light-transmissive member 51 and the upper surface of the second light-transmissive member 52 with a mold or the like so that the upper surface of the first light-transmissive member 51 and the upper surface of the second light-transmissive member 52 will be exposed.

Figure 3E:
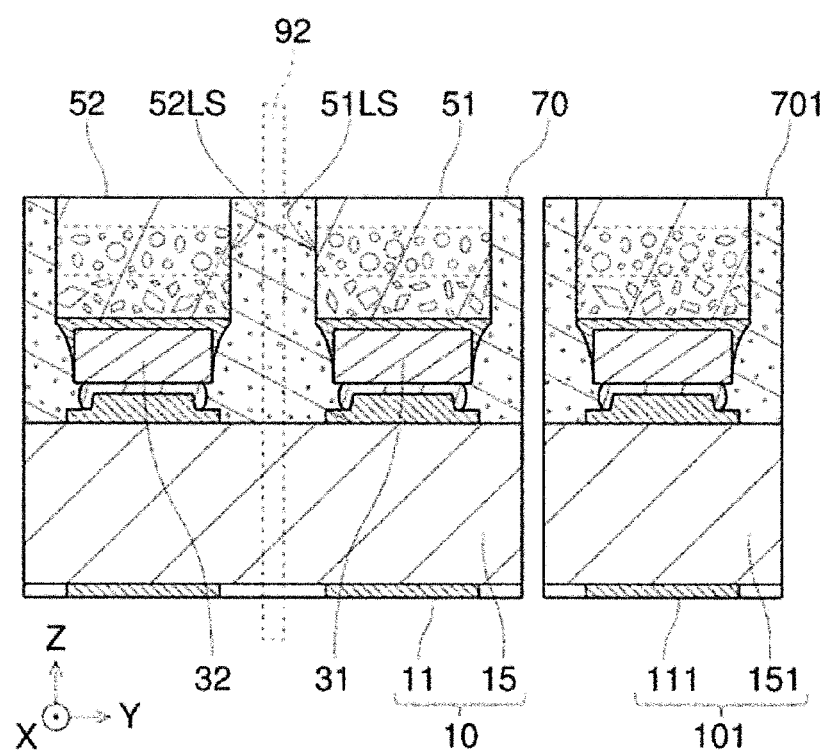
FIG. 3E is a schematic cross-sectional view for illustrating a fifth step in the method for manufacturing the light-emitting device according to the embodiment of the present disclosure.

The fifth step is a step, after the fourth step, of cutting the substrate 10 and the covering member 70 between the first lateral surface 51L or the modified first lateral surface 51LS, and the second lateral surface 52L or the modified second lateral surface 52LS, as shown in FIG. 3E. More specifically, for example, a cutting tool 92 that is a disc-shaped rotary blade is set at the center in the Y direction between the first lateral surface 51L or the modified first lateral surface 51LS, and the second lateral surface 52L or the modified second lateral surface 52LS, with the faces of the disc being parallel to the X direction, and the cutting tool 92 travels in the X direction to cut the substrate 10 and the covering member 70. At this time, the substrate 10 and the covering member 70 are cut so that at least one, preferably both, of a portion of the covering member 70 covering the first lateral surface 51L or the modified first lateral surface 51LS, and another portion of the covering member 70 covering the second lateral surface 52L and the modified second lateral surface 52LS will remain. In this fifth step, the cutting tool 92 used preferably has a thickness smaller than the gap between the first lateral surface 51L or the modified first lateral surface 51LS, and the second lateral surface 52L or the modified second lateral surface 52LS at the time the fourth step has been completed in view of ease of ensuring a sufficient thickness of the covering member 70.

The above method for manufacturing the light-emitting device 100 according to the first embodiment does not require cutting to separate the first light-transmissive member 51 from the second light-transmissive member 52 because the first light-transmissive member 51 and the second light-transmissive member 52 that have been divided in advance are respectively bonded to the first light-emitting element 31 and the second light-emitting element 32 separately from each other in the second step. For this reason, cutting quantities of the first light-transmissive member 51 and the second light-transmissive member 52 can be reduced. Even if the gap between the first lateral surface 51L and the second lateral surface 52L after completing the second step is insufficient, the gap can be corrected by scraping the first lateral surface 51L and/or the second lateral surface 52L in the third step. For this reason, the thickness of the covering member 70 charged between the first lateral surface 51L or the modified first lateral surface 51LS, and the second lateral surface 52L or the modified second lateral surface 52LS can be precisely managed. Thus, the method for manufacturing the light-emitting device 100 according to the first embodiment can ensure a sufficient thickness of the covering member 70 covering the lateral surfaces of the first light-transmissive member 51 and the lateral surfaces of the second light-transmissive member 52 while reducing the cutting quantities of the first light-transmissive member 51 and the second light-transmissive member 52.

Flip-chip mounting of the first light-emitting element 31 and the second light-emitting element 32, in other words, baking of the electrically-conductive adhesive members 20, is usually performed at a comparatively high temperature, for example, a temperature higher than the temperature at the time of soldering the light-emitting device 100 to the circuit substrate or the like. For this reason, deterioration of the first light-transmissive member 51 and the second light-transmissive member 52 due to heat can be suppressed by bonding the first light-transmissive member 51 and the second light-transmissive member 52 to the first light-emitting element 31 and the second light-emitting element 32 after flip-chip mounting the first light-emitting element 31 and the second light-emitting element 32. In particular, in the case where the first light-transmissive member 51 and the second light-transmissive member 52 contain the wavelength conversion substance 60, deterioration of the wavelength conversion substance 60 due to heat can be suppressed. Examples of the wavelength conversion substance 60 having a comparatively low heat resistance include manganese-activated fluoride fluorescent materials. However, in the case where the first light-transmissive member 51 and the second light-transmissive member 52 that have been divided in advance are respectively bonded to the first light-emitting element 31 and the second light-emitting element 32 adhering to the substrate 10, it is difficult to precisely control the gap between the first lateral surface 51L and the second lateral surface 52L only with bonding techniques. The third step in the present embodiment also solves such a problem.

The following describes a preferable aspect of the method for manufacturing the light-emitting device 100 according to the first embodiment in detail.

In the third step, the cutting tool 90 used preferably has a thickness larger than the gap between the first lateral surface 51L and the second lateral surface 52L at the time the second step has been competed, as shown in FIG. 3C. This constitution enables scraping of the first lateral surface 51L and the second lateral surface 52L with one cutting tool 90 at once. Accordingly, the gap between the modified first lateral surface 51LS and the modified second lateral surface 52LS is easily managed, and thus the thickness of the covering member 70 to be charged in the gap is easily managed. In addition, the first lateral surface 51L and the second lateral surface 52L can be scraped with fewer man-hours.

The first light-transmissive member 51 and the second light-transmissive member 52 each contain the matrix 55 and the wavelength conversion substance 60 contained in the matrix 55, as shown in FIG. 1B and FIG. 3B. The wavelength conversion substance 60 absorbs primary light from the first light-emitting element 31 and the second light-emitting element 32 and emits secondary light that differs in wavelengths from the primary light. Before the third step, the first lateral surface 51L and the second lateral surface 52L each have projections attributable to existence of the wavelength conversion substance 60. In this case, these projections are preferably chipped off in the third step. Directly covering the projections on the first lateral surface 51L and the second lateral surface 52L with the light-reflective covering member 70 forms light confining regions, which tend to result in losses of light. Thus, it is preferable to chip these projections off in the third step to level the modified first lateral surface 51LS and/or the modified second lateral surface 52LS.

As shown in FIG. 1B and FIG. 3B, the wavelength conversion substance 60 includes a first fluorescent material 61. The matrix 55 of the first light-transmissive member 51 and the second light-transmissive member 52 is a silicone resin or a modified silicone resin. The first fluorescent material 61 is preferably a SiAlON (Si—Al—O—N) fluorescent material. Particles of a SiAlON fluorescent material are comparatively hard, and a silicone resin or a modified silicone resin is a comparatively soft resin. For this reason, at the time of forming the first light-transmissive member 51 and the second light-transmissive member 52, such as singulation from the sheet, the SiAlON fluorescent material tends to remain protruding beyond the cut surface of the silicone resin or the modified silicone resin and tends to form the projections on the first lateral surface 51L and the second lateral surface 52L. Thus, it is technically meaningful to chip these projections off in the third step to level the modified first lateral surface 51LS and/or the modified second lateral surface 52LS.

As shown in FIG. 1B and FIG. 3B, the wavelength conversion substance 60 includes a second fluorescent material 62. The second fluorescent material 62 is a manganese-activated fluoride fluorescent material. In this case, the first lateral surface 51L and the second lateral surface 52L are preferably scraped with a dry cutting device in the third step. A manganese-activated fluoride fluorescent material is preferable in view of color reproducibility because emission of light having a comparatively narrow spectral linewidth can be obtained, but this material has a property of being easily deteriorated by water. Accordingly, scraping the first lateral surface 51L and the second lateral surface 52L with a dry cutting device can suppress or prevent deterioration of the manganese-activated fluoride fluorescent material due to water such as cutting water and cooling water.

As shown in FIG. 1A, FIG. 1B, and FIG. 3A to FIG. 3E, the shapes in a top view (front view) of the first light-emitting element 31, the second light-emitting element 32, the first light-transmissive member 51, and the second light-transmissive member 52 each include two long lateral surfaces extending in the first direction and two short lateral surfaces that extend in the second direction perpendicular to the first direction and are shorter than the long lateral surfaces. In this case, the first lateral surface 51L and the second lateral surface 52L are preferably the long lateral surfaces extending in the first direction. This is because it is technically meaningful in view of light extraction efficiency to manage the thickness of the covering member 70 covering the long lateral surfaces of the first light-transmissive member 51 and the second light-transmissive member 52.

To obtain a preferable thickness of the covering member 70, the gap between the modified first lateral surface 51LS and the modified second lateral surface 52LS is preferably set in the following range. The lower limit is preferably equal to or more than 0.05 mm, more preferably equal to or more than 0.07 mm, in view of efficient extraction of light toward the front direction of the device while suppressing lateral light leakage. The upper limit is preferably equal to or less than 0.4 mm, more preferably equal to or less than 0.32 mm, in view of thinning or miniaturizing the light-emitting device.

The following describes the components of the light-emitting device according to the embodiment of the present disclosure.

(Light-Emitting Device 100)

The light-emitting device is, for example, a light-emitting diode (LED). The light-emitting device in the first embodiment is a side-view device but can be a top-view device. In a side-view light-emitting device, the mounting direction is perpendicular to the main emitting direction. In a top-view light-emitting device, the mounting direction is parallel to the main emitting direction. The shape in a front view, that is, the shape taken from the main emitting direction, of the light-emitting device can be selected as appropriate, but a rectangular shape is preferable in terms of mass production. In particular, the shape in a front view in the case of the side-view light-emitting device is preferably a rectangle having a longitudinal direction and a short direction. The shape in a front view in the case of the top-view light-emitting device is preferably a square. The first light-emitting element and the second light-emitting element preferably have shapes in a front view similar to the shape of the light-emitting device.

(Substrate 10 and Substrate Piece 101)

The substrate is constituted of at least the wirings and the base supporting the wirings. In addition, the substrate may include an insulating protective film such as a solder mask and a coverlay. The same applies to the substrate piece.

(Wirings 11 and 111)

The wirings are formed at least on the upper surface (front surface) of the base and may be formed inside and/or on the lateral surface and/or on the lower surface (back surface) of the base. The wirings preferably include the element-connecting terminal portions on which the light-emitting elements are mounted, the external-connecting terminal portions connected to external circuits, and the lead wiring portions connecting these terminal portions. The wirings can be formed of copper, iron, nickel, tungsten, chromium, aluminum, silver, gold, titanium, palladium, rhodium, or an alloy of these metals. A layer or a plurality of layers of these metals or alloys may be used. In particular, copper or a copper alloy is preferable in view of the heat dissipation performance. Surface layers of the wirings may be layers of materials such as silver, platinum, aluminum, rhodium, gold, and alloys of these metals in view of wettability and/or light reflectivity and the like of connecting members.

(Bases 15 and 151)

In the case of a rigid substrate, the base can be constituted of a resin or a fiber-reinforced resin, a ceramic, glass, metal, paper, or the like. Examples of the resin or the fiber-reinforced resin include epoxy resins, glass epoxy resins, bismaleimide-triazine (BT) resin, and polyimides. Examples of the ceramic include aluminum oxide, aluminum nitride, zirconium oxide, zirconium nitride, titanium oxide, titanium nitride, and mixtures of these materials. Examples of the metal include copper, iron, nickel, chromium, aluminum, silver, gold, titanium, and alloys of these metals. In the case of a flexible substrate, the base can be constituted of a polyimide, poly(ethylene terephthalate), poly(ethylene naphthalate), a liquid crystal polymer, a cycloolefin polymer, or the like. Among these base materials, use of a base material having physical properties similar to the linear expansion coefficient of the light-emitting element is particularly preferable.

(Electrically-Conductive Adhesive Members 20)

Any one of bumps of gold, silver, copper, or the like, a metal paste containing powder of a metal such as silver, gold, copper, platinum, aluminum, and palladium and a resin binder, a tin-bismuth, tin-copper, tin-silver, or gold-tin solder or the like, and a brazing filler metal such as a low-melting-point metal can be used as the electrically-conductive adhesive members.

(Light-Emitting Element 30, First Light-Emitting Element 31, and Second Light-Emitting Element 32)

The light-emitting element includes at least a semiconductor element structure and, in most cases, a substrate. Examples of the light-emitting element include LED chips. The shape in a front view of the light-emitting element is preferably a rectangle, in particular a square or a rectangle that is long in one direction, but other shapes may be employed. For example, a hexagon can increase the light-emission efficiency. The lateral surfaces of the light-emitting element or its substrate may be perpendicular to the upper surface or may be inclined inward or outward. The light-emitting element preferably has positive and negative (p and n) electrodes on the same side. The number of the light-emitting element mounted on one light-emitting device may be one or equal or more than two. A plurality of light-emitting elements can be connected in series or in parallel. The semiconductor element structure includes a layered body of semiconductor layers, that is, at least an n-type semiconductor layer and a p-type semiconductor layer. An active layer is preferably disposed between the semiconductor layers. The semiconductor element structure may include positive and negative electrodes and/or an insulating film. The positive and negative electrodes can be constituted of gold, silver, tin, platinum, rhodium, titanium, aluminum, tungsten, palladium, nickel, or an alloy of these metals. The insulating film can be constituted of an oxide or a nitride of at least one element selected from the group consisting of silicon, titanium, zirconium, niobium, tantalum, and aluminum. The emission peak wavelength of the light-emitting element can be selected from the ultraviolet range to the infrared range depending on the semiconductor material or its mixing ratio of the crystal. A nitride semiconductor, which can emit short-wavelength light that can efficiently excite the wavelength conversion substance is preferably used as the semiconductor material. The nitride semiconductor is typically represented by the general formula $In_xAl_yGa_{1-x-y}N$ ($0 \leq x$, $0 \leq y$, $x+y \leq 1$). The emission peak wavelength of the light-emitting element is preferably equal to or more than 400 nm and equal to or less than 530 nm, more preferably equal to or more than 420 nm and equal to or less than 490 nm, and even more preferably equal to or more than 450 nm and equal to or less than 475 nm in view of light-emission efficiency, color mixing relations between excitation of the wavelength conversion substance and its light emission, and the like. In addition, InAlGaAs semiconductors, InAlGaP semiconductors, zinc sulfide, zinc selenide, silicon carbide, and the like can also be used. The substrate of the light-emitting element is typically a crystal growth substrate on which a semiconductor crystal constituting the semiconductor element structure can be grown, but a substrate for connecting that is connected to the semiconductor element structure separated from a crystal growth substrate may be employed. A light-transmissive substrate facilitates employment of flip-chip mounting and enhancement of light extraction efficiency. Examples of the matrix of the substrate include sapphire, spinel, gallium nitride, aluminum nitride, silicon, silicon carbide, gallium arsenide, gallium phosphide, indium phosphide, zinc sulfide, zinc oxide, zinc selenide, and diamond. Among these materials, sapphire is preferable. The thickness of the substrate is, for example, equal to or more than 0.02 mm and equal to or less than 1 mm preferably equal to or more than 0.05 mm and equal to or less than 0.3 mm in view of the strength of the substrate and the thickness of the light-emitting device.

(Light-Guiding Member 40)

The light-guiding member bonds the light-emitting element to the light-transmissive member and guides light from the light-emitting element to the light-transmissive member. Examples of the matrix of the light-guiding member include silicone resins, epoxy resins, phenolic resins, polycarbonate resins, acrylic resins, and modified resins of these resins. Among these materials, silicone resins and modified silicone resins have good heat resistance and light resistance and are thus preferable. Specific examples of silicone resins include dimethyl silicone resin, phenyl-methyl silicone resin, and diphenyl silicone resin. The matrix of the light-guiding member may contain a filler similar to a filler in the matrix of the light-transmissive member to be described later. The "modified resins" in the present specification include hybrid resins hereinafter.

(Light-Transmissive Member 50, First Light-Transmissive Member 51, and Second Light-Transmissive Member 52)

The light-transmissive member is disposed on the light-emitting element and transmits light emitted from the light-emitting element to the outside of the device. The light-transmissive member is constituted of at least the matrix below. The light-transmissive member can function as a wavelength conversion member if the wavelength conversion substance below is contained in the matrix. The wavelength conversion substance is not necessarily contained. A sintered body of the wavelength conversion substance and an inorganic material such as alumina, a plate-shaped crystal of the wavelength conversion substance, or the like can be used as the light-transmissive member.

(Matrix 55 of Light-Transmissive Member)

The matrix of the light-transmissive member is not limited as long as the matrix is light-transmissive to light emitted from the light-emitting element. The term "light-transmissive" means that the light transmittance at the emission peak wavelength of the light-emitting element is preferably equal to or more than 60%, more preferably equal to or more than 70%, and even more preferably equal to or more than 80%. A silicone resin, an epoxy resin, a phenolic resin, a polycarbonate resin, an acrylic resin, or a modified resin of these resins can be used as the matrix of the light-transmissive member. Glass may also be employed. Among these materials, silicone resins and modified silicone resins have good heat resistance and light resistance and are thus preferable. Specific examples of silicone resins include dimethyl silicone resin, phenyl-methyl silicone resin, and diphenyl silicone resin. The light-transmissive member may be constituted of a layer of one of these matrices or may be constituted by layering equal to or more than two of these matrices.

The matrix of the light-transmissive member may contain any of various fillers in any of the above resins or glass. Examples of the fillers include silicon oxide, aluminum oxide, zirconium oxide, and zinc oxide. These fillers can be used singly or in combination of equal to or more than two. In particular, silicon oxide, which has a small coefficient of thermal expansion, is preferable. Using nanoparticles as the filler can increase scattering including Rayleigh scattering of blue light from the light-emitting element and reduce the quantity of the wavelength conversion substance used. The nanoparticles are particles having grain diameters of equal to or more than 1 nm and equal to or less than 100 nm. The "grain diameter" in the present specification, for example, is defined as $D_{50}$.

(Wavelength Conversion Substance 60)

The wavelength conversion substance absorbs at least part of the primary light emitted from the light-emitting element and emits the secondary light that differs in wavelengths from the primary light. This can provide a light-emitting device that emits mixed light, such as white light, of the primary light having visible wavelengths and the secondary light having visible wavelengths. Specific examples below of the wavelength conversion substance can be used singly or in combination of equal to or more than two.

(First Fluorescent Material 61 and Second Fluorescent Material 62)

The first fluorescent material and the second fluorescent material can be selected from the specific examples below as appropriate. For example, the first fluorescent material can be a fluorescent material that emits green or yellow light, and the second fluorescent material can be a fluorescent material that emits red light. Examples of the fluorescent material that emits green light include yttrium-aluminum-garnet fluorescent materials (for example, $Y_3(Al,Ga)_5O_{12}$:Ce), lutetium-aluminum-garnet fluorescent materials (for example, $Lu_3(Al,Ga)_5O_{12}$:Ce), terbium-aluminum-garnet fluorescent materials (for example, $Tb_3(Al,Ga)_5O_{12}$:Ce) fluorescent materials, silicate fluorescent materials (for example, $(Ba,Sr)_2SiO_4$:Eu), chlorosilicate fluorescent materials (for example, $Ca_8Mg(SiO_4)_4Cl_2$:Eu), β-SiAlON fluorescent materials (for example, $Si_{6-z}Al_zO_zN_{8-z}$:Eu ($0<z<4.2$)), and SGS fluorescent materials (for example, $SrGa_2S_4$:Eu). Examples of the fluorescent material that emits yellow light include α-SiAlON fluorescent materials (for example, $M_z(Si,Al)_{12}(O,N)_{16}$ (where $0<z\leq2$, M is Li, Mg, Ca, Y, or a lanthanoid element except for La and Ce)). Some of the above fluorescent materials that emit green light emit yellow light. For example, yellow light can be obtained by substituting part of Y in an yttrium-aluminum-garnet fluorescent material with Gd to shift its emission peak wavelength to a longer wavelength. These materials also include fluorescent materials that can emit orange light. Examples of the fluorescent material that emits red light include nitrogen-containing calcium aluminosilicate (CASN or SCASN) fluorescent materials (for example, (Sr,Ca)AlSiN$_3$:Eu). The examples also include manganese-activated fluoride fluorescent materials (fluorescent materials represented by the general formula (I) $A_2[M_{1-a}Mn_aF_6]$ (in the general formula (I), A is at least one selected from the group consisting of K, Li, Na, Rb, Cs, and NH$_4$, M is at least one element selected from the group consisting of the Group 4 elements and the Group 14 elements, and a satisfies $0<a<0.2$)). Typical examples of the manganese-activated fluoride fluorescent materials include manganese-activated potassium fluorosilicate fluorescent materials (for example, $K_2SiF_6$:Mn).

(Light-Reflective Covering Members 70 and 701)

The light reflectance of the light-reflective covering member at the emission peak wavelength of the light-emitting element is preferably equal to or more than 70%, more preferably equal to or more than 80%, and even more preferably equal to or more than 90%, in view of forward light extraction efficiency. In addition, the covering member is preferably white. Thus, the covering member preferably contains the white pigment in the matrix. The covering member goes through a liquid state before being cured. The covering member can be formed by transfer molding, injection molding, compression molding, potting, or the like.

(Matrix 75 of Covering Member)

The matrix of the covering member can be a resin, and examples of the resin include silicone resins, epoxy resins, phenolic resins, polycarbonate resins, acrylic resins, and modified resins of these resins. Among these resins, silicone resins and modified silicone resins have good heat resistance and light resistance and are thus preferable. Specific examples of silicone resins include dimethyl silicone resin, phenyl-methyl silicone resin, and diphenyl silicone resin. The matrix of the covering member may contain a filler similar to the above filler in the matrix of the light-transmissive member.

(White Pigment 77)

As the white pigment, one of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide can be used singly, or equal to or more than two of these materials can be used in combination. The shape of the white pigment is not limited to particular shapes. The shape may be indefinite or crushed, but is preferably spherical in view of fluidity. The grain diameter of the white pigment is, for example, about equal to or more than 0.1 μm and equal to or less than 0.5 μm but smaller grain diameters are preferable to enhance effects of light reflection and covering. The content of the white pigment in the light-reflective covering member can be selected as appropriate. In view of light reflectivity, the viscosity in a liquid state, and the like, the content is, for example, preferably equal to or more than 10 wt % and equal to or less than 80 wt %, more preferably equal to or more than 20 wt % and equal to or less than 70 wt %, and even more preferably equal to or more than 30 wt % and equal to or less than 60 wt %. The term "wt %" means percentage by weight, that is, the proportion of the weight of a material of interest to the total weight of the light-reflective covering member.

EXAMPLE

The following describes an example according to the present disclosure in detail. Needless to say, the present disclosure is not limited to the following example only.

Example 1

A light-emitting device in Example 1 is a side-view LED with a width (lateral) of 1.8 mm, a thickness (longitudinal) of 0.32 mm, and a depth of 0.70 mm having the structure of the light-emitting device 100 shown in FIGS. 1A and 1B.

The size of a substrate piece 101 is 1.8 mm in width (lateral), 0.32 mm in thickness (longitudinal), and 0.36 mm in depth. A base 151 is a rectangular-cuboid piece made of BT resin (for example, HL832NSF type LCA manufactured by Mitsubishi Gas Chemical Company, Inc.). A pair of positive and negative wirings 111 are made of copper/nickel/gold layered from the base 151 side. The pair of positive and negative wirings 111 each include an element-connecting terminal portion formed on the central side in the lateral direction on the front surface of the base 151, a lead wiring portion, and an external-connecting terminal portion that is exposed on the left/right side from a covering member 701 to be described later and is formed from the left/right end portion of the front surface of the base 151 to the left/right end portion of the back surface through the lateral surface. The copper layer of the element-connecting terminal portion includes a projection having a depth of 0.04 mm.

One light-emitting element 30 is flip-chip mounted on the element-connecting terminal portions of the pair of positive and negative wirings 111 via electrically-conductive adhesive members 20. The light-emitting element 30 is a rectangular-cuboid LED chip that includes an n-type layer, an active layer, and a p-type layer, each of which are made of a nitride semiconductor, layered in order on a sapphire substrate. The light-emitting element 30 can emit blue (emission peak wavelength of 452 nm) light and has a width (lateral) of 1.1 mm, a thickness (longitudinal) of 0.2 mm, and a depth of 0.12 mm. The electrically-conductive adhesive members 20 are gold-tin solder (Au:Sn=79:21) and have a depth of 0.015 mm.

On the light-emitting element 30, a light-transmissive member 50 is bonded with a light-guiding member 40 sandwiched therebetween. The light-transmissive member 50 is a rectangular-cuboid piece having a width (lateral) of 1.21 mm, a thickness (longitudinal) of 0.24 mm, and a depth of 0.16 mm in which a phenyl-methyl silicone resin matrix 55 containing silicon oxide nanoparticles as a filler contains, as a wavelength conversion substance 60, europium-activated β-SiAlON, which is a first fluorescent material 61, and manganese-activated potassium fluorosilicate, which is a second fluorescent material 62. The light-transmissive member 50 is made of a layer of the matrix 55 and the first fluorescent material 61, a layer of the matrix 55 and the second fluorescent material 62, and a layer of the matrix 55, each of which is layered in this order from the light-emitting element 30 side. The light-guiding member 40 is a cured product of dimethyl silicone resin having a depth of 0.005 mm.

The light-reflective covering member 701 is formed on the front surface of the substrate piece 101 to encompass the entire side peripheries of the light-emitting element 30 and the light-transmissive member 50. The covering member 701 has a width (lateral) of 1.35 mm and a thickness (longitudinal) of 0.32 mm and includes a matrix 75 that is a cured product of phenyl-methyl silicone resin, and 60 wt % of titanium oxide as a white pigment 77. The covering member 701 directly covers the lateral surfaces of the light-emitting element 30, the lateral surfaces of the light-guiding member 40, and the lateral surfaces of the light-transmissive member 50. The front surface of the covering member 701 and the front surface of the light-transmissive member 50 constitute approximately the same surface.

The light-emitting device in Example 1 is produced as follows. In this Example 1, a substrate 10 having a structure shown in FIG. 2 is used.

(First Step)

A plurality of light-emitting elements including a first light-emitting element 31 and a second light-emitting element 32 are aligned in the longitudinal direction, that is, in the Y direction, and are each flip-chip mounted on the substrate 10 so that the light-emitting elements will be separated from one another. More specifically, a gold-tin solder paste that is to be the electrically-conductive adhesive member 20 is applied to each element-connecting terminal portion of wirings 11 on the substrate 10, each light-emitting element is mounted on the paste, and the gold-tin solder is then molten by reflow (in which the highest temperature is 320° C.) and solidified. At this time, the light-emitting elements are aligned so that the light-emitting elements will be long in the lateral direction, that is, in the X direction, that is, so that their long lateral surfaces will face each other. The interval (center-to-center distance) between the first light-emitting element 31 and the second light-emitting element 32 is 0.37 mm.

(Second Step)

Next, the light-transmissive members are respectively bonded to the light-emitting elements with the light-guiding members sandwiched therebetween to form a plurality of light-emitting structures. That is, at least the first light-transmissive member 51 is bonded to the first light-emitting element 31 with one light-guiding member 40 sandwiched therebetween, and the second light-transmissive member 52 is bonded to the second light-emitting element 32 with another light-guiding member 40 sandwiched therebetween. At this time, a first lateral surface 51L, which is one of the long lateral surfaces of a first light-transmissive member 51, is separated from and faces a second lateral surface 51L, which is one of the long lateral surfaces of a second light-transmissive member 52. More specifically, a liquid resin that is to be the light-guiding members 40 is applied to each of the first light-emitting element 31 and the second light-emitting element 32, the first light-transmissive member 51 and the second light-transmissive member 52 are respectively mounted on the liquid resin, and the resin is cured by heating in an oven. The gap between the first lateral surface 51L and the second lateral surface 52L in this case is 0.08 to 0.09 mm. Each light-transmissive member is produced by cutting a sheet into pieces with a dry cutting device having an ultrasonic cutter as a cutting blade. The sheet is formed by bonding a first sheet made of the matrix 55 and a first fluorescent material 61, a second sheet made of the matrix 55 and a second fluorescent material 61, and a third sheet made of the matrix 55 by thermocompression bonding in this order. At this time, the first lateral surface 51L and the second lateral surface 52L each have projections typically attributable to existence of the first fluorescent material 61 that is β-SiAlON.

(Third Step)

Next, the long lateral surface of the light-transmissive member of each light-emitting structure is scraped. That is, at least the first lateral surface 51L of the first light-transmissive member and/or the second lateral surface 52L of the second light-transmissive member are scraped to expose a modified first lateral surface 51LS and/or a modified second lateral surface 52LS. More specifically, a cutting tool 90 that is a dicing blade having a thickness of 0.13 mm included in the dry cutting device is set at a position in the Y direction at which the blade of the cutting tool 90 has contact with at least one of the first lateral surface 51L and the second lateral surface 52L, with the faces of the blade being parallel to the X direction, and the cutting tool 90 travels in the X direction on the substrate 10. This procedure chips the projections off and levels the modified first lateral surface 51LS and the modified second lateral surface 52LS. After this procedure, short lateral surfaces of the light-transmissive member of each light-emitting structure may be scraped in the same manner.

(Fourth Step)

Next, a light-reflective covering member 70 for covering the lateral surfaces of each light-emitting structure is formed on the substrate 10. More specifically, the covering member 70 is formed on the substrate 10 with a transfer molding machine so that a plurality of light-emitting structures aligned in the Y direction will be completely buried in the covering member 70 that is one rectangular-cuboid block. The covering member 70 is then ground from above with a grinding device to expose the upper surface of each light-transmissive member.

(Fifth Step)

Finally, the substrate 10 and the covering member 70 are cut between the light-emitting structures to cingulate the light-emitting device 100. More specifically, a cutting tool 92 that is a dicing blade having a thickness of 0.05 mm is set at the center in the Y direction between the first lateral surface 51L or the modified first lateral surface 51LS, and the second lateral surface 52L or the modified second lateral surface 52LS, with the faces of the blade being parallel to the X direction, and the cutting tool 92 travels in the X direction to cut the substrate 10 and the covering member 70.

A light-emitting device according to an embodiment of the present disclosure can be used for backlight devices of liquid-crystal displays, various lighting apparatuses, large format displays, various displays for advertisements or destination guide, and projectors, as well as for image scanners for apparatuses such as digital video cameras, facsimile machines, copying machines, and scanners.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A method for manufacturing a light-emitting device, the method comprising in order:
   flip-chip mounting a first light-emitting element and a second light-emitting element on a substrate separately from each other;
   bonding a first light-transmissive member having a first lateral surface to the first light-emitting element;
   bonding a second light-transmissive member having a second lateral surface to the second light-emitting element such that the second lateral surface is separated from and faces to the first lateral surface;
   scraping at least one of the first lateral surface and the second lateral surface to expose at least one of a modified first lateral surface and a modified second lateral surface;
   providing a light-reflective covering member on the substrate to cover the first lateral surface or the modified first lateral surface, and the second lateral surface or the modified second lateral surface; and
   cutting the substrate and the covering member between the first lateral surface or the modified first lateral surface, and the second lateral surface or the modified second lateral surface.

2. The method according to claim 1,
   wherein a cutting tool having a thickness larger than a gap between the first lateral surface and the second lateral surface on completion of bonding the first light-transmissive member and the second light-transmissive member is used in scraping at least one of the first lateral surface and the second lateral surface.

3. The method according to claim 1,
   wherein the first light-transmissive member and the second light-transmissive member each comprise:
   a matrix; and
   a wavelength conversion substance in the matrix, the wavelength conversion substance absorbing primary light from the first light-emitting element and the second light-emitting element to emit secondary light different in wavelengths from the primary light,
   wherein the first lateral surface and the second lateral surface each have at least one projection before scraping at least one of the first lateral surface and the second lateral surface, the at least one projection being attributable to existence of the wavelength conversion substance, and
   wherein the at least one projection is chipped off in scraping at least one of the first lateral surface and the second lateral surface.

4. The method according to claim 3,
   wherein the matrix comprises a silicone resin or a modified silicone resin,
   wherein the wavelength conversion substance comprises a first fluorescent material, and
   wherein the first fluorescent material comprises a SiAlON fluorescent material.

5. The method according to claim 1,
   wherein the first light-transmissive member and the second light-transmissive member each comprise:

a matrix; and
a wavelength conversion substance in the matrix, the wavelength conversion substance absorbing primary light from the first light-emitting element and the second light-emitting element to emit secondary light different in wavelengths from the primary light,
wherein the wavelength conversion substance comprises a second fluorescent material,
wherein the second fluorescent material comprises a manganese-activated fluoride fluorescent material, and
wherein at least one of the first lateral surface and the second lateral surface is scraped with a dry cutting device in scraping at least one of the first lateral surface and the second lateral surface.

6. The method according to claim 1,
wherein shapes in a top view of the first light-emitting element, the second light-emitting element, the first light-transmissive member, and the second light-transmissive member each comprise:
two long lateral surfaces extending in a first direction; and
two short lateral surfaces extending in a second direction perpendicular to the first direction, the short lateral surfaces being shorter than the long lateral surfaces, and
wherein the first lateral surface and the second lateral surface are the long lateral surfaces.

7. The method according to claim 1,
wherein a gap between the modified first lateral surface and the modified second lateral surface is equal to or more than 0.05 mm and equal to or less than 0.4 mm.

* * * * *